(12) United States Patent
Nagatsuka

(10) Patent No.: US 7,384,203 B2
(45) Date of Patent: Jun. 10, 2008

(54) POWER CONVERSION APPARATUS

(75) Inventor: Yoshio Nagatsuka, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 11/632,050

(22) PCT Filed: Mar. 15, 2006

(86) PCT No.: PCT/JP2006/305114

§ 371 (c)(1),
(2), (4) Date: Jan. 10, 2007

(87) PCT Pub. No.: WO2006/098357

PCT Pub. Date: Sep. 21, 2006

(65) Prior Publication Data
US 2007/0189675 A1    Aug. 16, 2007

(30) Foreign Application Priority Data
Mar. 16, 2005    (JP)   ............................. 2005-075526

(51) Int. Cl.
G02B 6/36    (2006.01)

(52) U.S. Cl. ...................................... 385/89

(58) Field of Classification Search ...................... None
See application file for complete search history.

(56) References Cited

FOREIGN PATENT DOCUMENTS

| | | |
|---|---|---|
| JP | 05-153199 A | 6/1993 |
| JP | 08-107404 A | 4/1996 |
| JP | 09-121531 A | 5/1997 |
| JP | 10-270120 A | 10/1998 |
| JP | 2003-143832 A | 5/2003 |

OTHER PUBLICATIONS

Translated "Detailed Description" of Morita, JP 10-270120.*

* cited by examiner

*Primary Examiner*—Michelle R. Connelly-Cushwa
*Assistant Examiner*—Chris Chu
(74) *Attorney, Agent, or Firm*—Buchanan Ingersoll & Rooney PC

(57) ABSTRACT

A power conversion apparatus is obtained which detects a mis-connection of optical fiber cables based on a difference in mode of feedback signals, and changes a phase sequence in an automatic manner only with the use of a logical composition of a microcomputer control section. A drive circuit 2 for driving a semiconductor device 1 includes a test signal recognition section 31 that outputs inherent feedback signals 32 in response to a test signal 30 from a microcomputer control section 3. The microcomputer control section 3 includes an optical fiber mis-connection detection section 29, 33 that detects a mis-connection state of the optical fibers 8 based on the inherent feedback signals 32. The optical fiber mis-connection detection section compares the inherent feedback signals 32 with the individual normal feedback signals stored beforehand, respectively, and detects a mis-connection state of the optical fibers 8 when it is indicated that at least one inherent feedback signal does not coincide with a corresponding normal feedback signal.

3 Claims, 5 Drawing Sheets

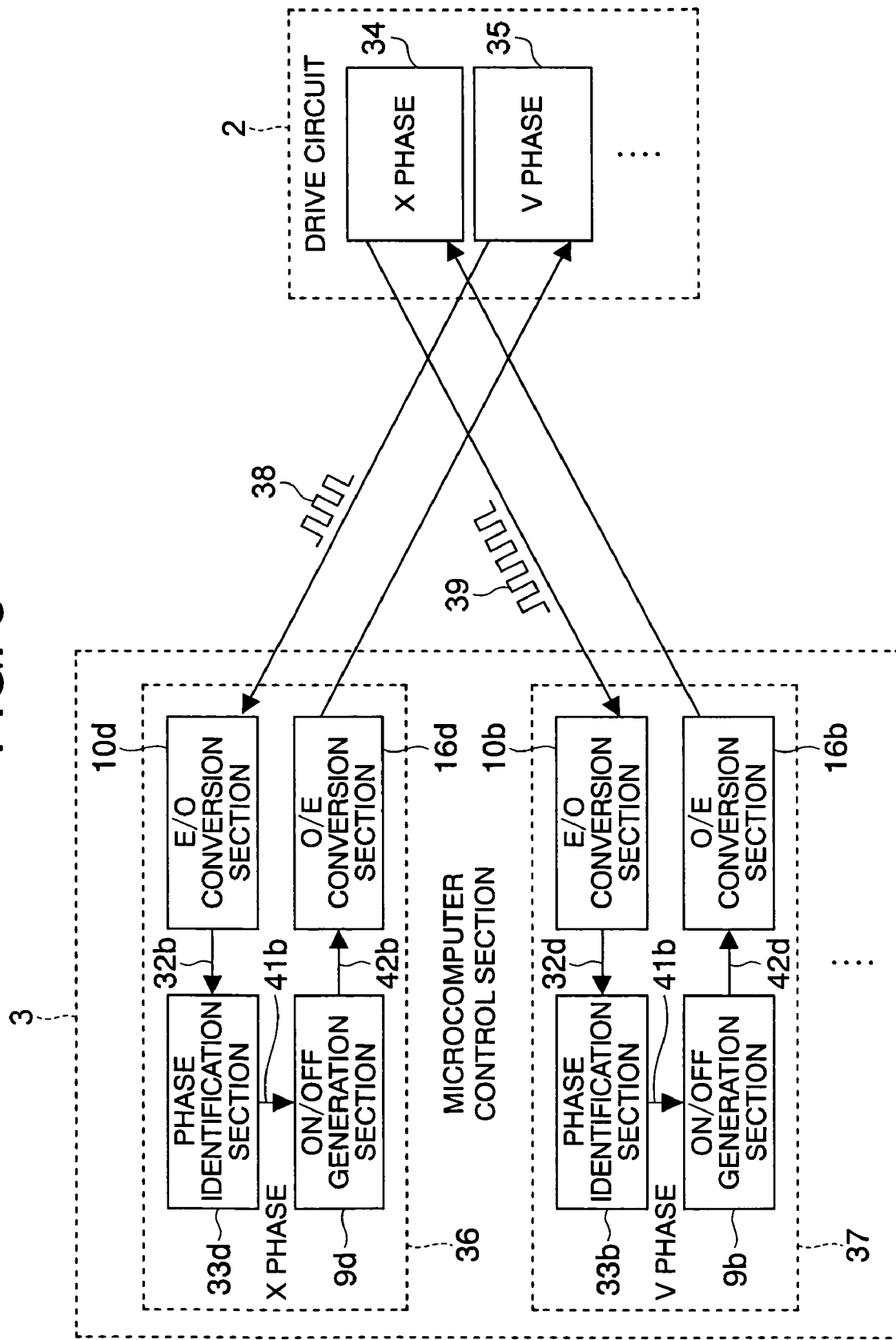

POWER CONVERSION APPARATUS

TECHNICAL FIELD

The present invention relates to a power conversion apparatus that uses optical fiber cables (hereinafter referred to simply as "optical fibers") as communication mediums. In particular, it relates to a new technique that is capable of switching optical fibers into normal phases in an automatic manner by detecting the mis-connected state of each of the optical fibers based on optical information passing through the optical fibers.

BACKGROUND ART

In general, in a power conversion apparatus comprising an inverter, a converter or the like, there are used a plurality of semiconductor devices (GTO, IGBT, etc.) corresponding to individual phases.

The semiconductor devices, which constitute a main circuit for power conversion, can not operate by themselves, so they are driven to operate under the control of a drive unit which is separately provided.

A conventional semiconductor drive unit comprises a drive circuit that is connected to individual semiconductor devices, and a microcomputer control part that controls the drive circuit (see, for example, a first patent document).

The drive circuit and the microcomputer control part each have an O/E conversion section and an E/O conversion section at their one end, and are connected to each other in individual phases through a plurality of optical fibers (communication mediums) that have end connector portions at opposite ends thereof.

Control signals of individual phases created by the microcomputer control part are converted into optical signals and then sent to the drive circuit through the individual optical fibers, and they are further converted into electric signals, which are impressed to the individual semiconductor devices thereby to turn on and off the individual semiconductor devices.

In addition, the drive circuit has a protection detection section that monitors the abnormality of each of the individual semiconductor devices, and inputs a fault signal to a fault processing circuit in the microcomputer control part thereby to stop the apparatus.

For example, in case where the power conversion apparatus is in the form of a three-phase two-level inverter, ON/OFF commands (control signals) for three phases (U phase, V phase and W phase) of an upper arm and three phases (X phase, Y phase and Z phase) of a lower arm have a phase difference of 120 degrees between adjacent phases, and the individual control signals are set in reverse logic with a dead time interposed between adjacent ones in such a manner that the control signals for the upper arm and the lower arm are not turned on at the same time.

At this time, for example, when an optical fiber corresponding to a semiconductor device of the X phase and an optical fiber corresponding to a semiconductor device of the V phase are exchanged or reversed with each other and mis-connected to the optical fibers of the V phase and the X phase, respectively, a semiconductor device of the upper arm and a semiconductor device of the lower arm can be turned on at the same time for each phase for a certain period of time if left as they are, thus giving rise to the possibility that an arm short fault might be caused to damage the semiconductor devices.

First Patent Document
Japanese patent application laid-open No. 2003-143832

DISCLOSURE OF THE INVENTION

Problems to be Solved by the Invention

The conventional power conversion apparatus can keep the power semiconductor devices to operate with high reliability, but it is involved in a plurality of semiconductor devices according to the number of phases thereof so in case where the phase sequence of connections of the individual optical fibers is mistaken, ON/OFF commands different from normal ones are output to the individual semiconductor devices. As a result, a problem arises in which there is a possibility of causing an abnormal operation or failure of the apparatus.

In addition, there is a further problem that even if an appropriate measure is to be taken upon occurrence of mis-connection of the individual optical fibers, there are a lot of optical fibers and hence a very long time is required to specify the location at which the mis-connection has occurred.

Accordingly, the present invention is intended to obviate the problems as referred to above, and has for its object to obtain a power conversion apparatus that can prevent an abnormal operation and failure beforehand without particularly inviting an increase in cost by constructing an optical fiber mis-connection detection section only with the logical configuration of a microcomputer control section.

In addition, another object of the present invention is to obtain a power conversion apparatus that can drive semiconductor devices in a normal manner by automatically specifying a mis-connected location of optical fibers without changing the connections of the optical fibers.

Means for Solving the Problems

A power conversion apparatus according to the present invention includes an inverter or converter having a plurality of semiconductor devices corresponding to a plurality of phases, a microcomputer control section that calculates and outputs a plurality of control signals to drive the individual semiconductor devices, respectively, a drive circuit that drives the individual semiconductor devices in accordance with the control signals, respectively, and a plurality of optical fibers that are connected between the microcomputer control section and the drive circuit so as to correspond to the individual semiconductor devices thereby to form communication mediums. The drive circuit includes a test signal recognition section that outputs proper or inherent feedback signals corresponding to the individual semiconductor devices in response to the test signals from the microcomputer control section. The microcomputer control section includes an optical fiber mis-connection detection section that detects a mis-connection state of each optical fiber based on the inherent feedback signals. Control signals and test signals corresponding to the semiconductor devices, respectively, are sent from the microcomputer control section to the drive circuit through the individual optical fibers, and inherent feedback signals corresponding to the individual semiconductor devices, respectively, are sent from the drive circuit to the microcomputer control section. At the time of connection of the plurality of optical fibers, the optical fiber mis-connection detection section sends the individual test signals to the drive circuit through the individual optical fibers. The drive circuit sends, through the individual optical fibers, the inherent feedback signals corresponding to the individual test signals to the optical fiber mis-connection detection section, where the individual inherent feedback signals are compared with the individual normal feedback signals stored beforehand, respectively, so that when it is indicated that at least one inherent feedback signal does not coincide with a corresponding normal feedback signal, the optical fiber mis-connection detection section detects a mis-connection state of the plurality of optical fibers.

Effects of the Invention

According to the present invention, by the provision of the optical fiber mis-connection detection section in the microcomputer control section, an abnormal operation and failure can be prevented in advance without particularly inviting an increase in cost.

BRIEF DESCRIPTION OF THE DRAWINGS

FIG. 5 is an explanatory view showing a state of mis-connection between an X phase and a V phase in the second embodiment of the present invention (Embodiment 2).

BEST MODE FOR CARRYING OUT THE INVENTION

Embodiment 1

Hereinafter, a first embodiment of the present invention will be described in detail while referring to the accompanying drawings.

Figure 1:
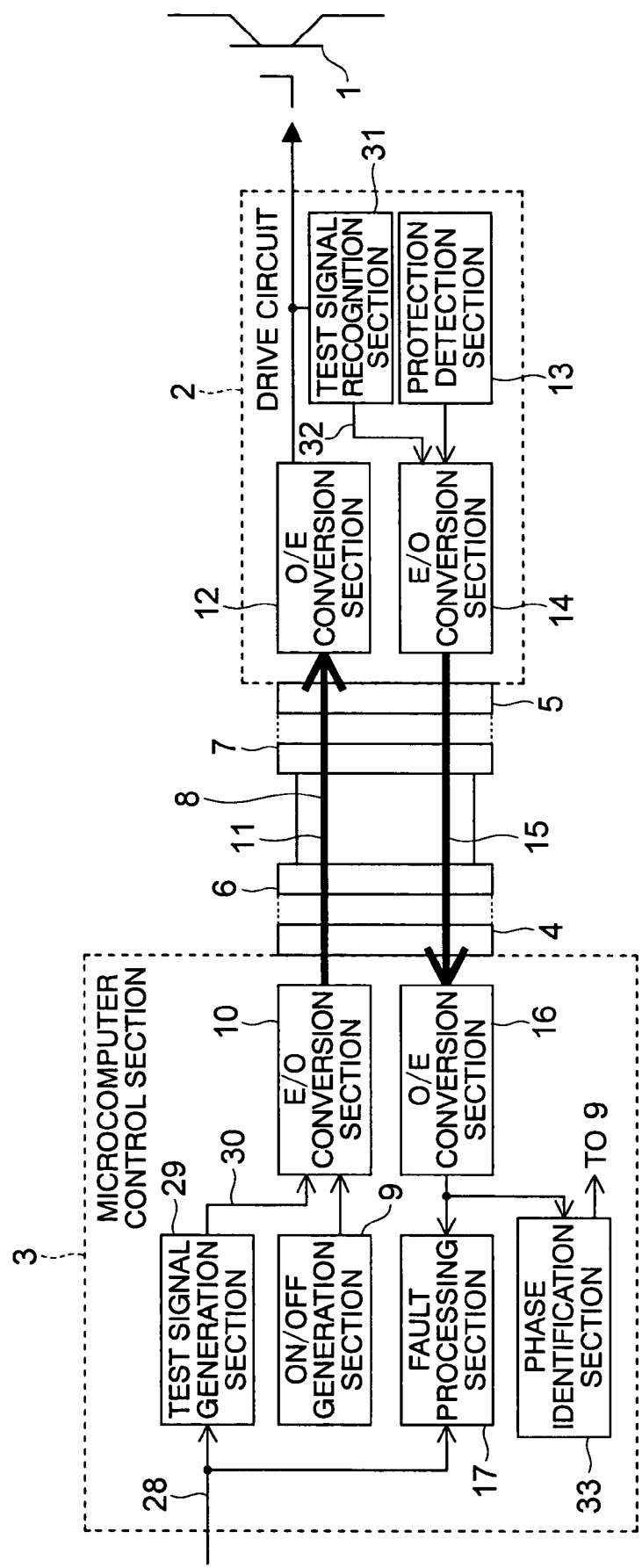
FIG. 1 is a block diagram showing a power conversion apparatus according to a first embodiment of the present invention (Embodiment 1).

FIG. 1 is a block diagram showing a power conversion apparatus according to the first embodiment of the present invention, wherein a semiconductor device 1 that constitutes a main circuit of the power conversion apparatus and a drive unit comprising a drive circuit 2 and a microcomputer control section 3 are illustrated in association with each other.

In FIG. 1, an inverter or a converter (not shown) comprises a plurality of semiconductor devices corresponding to an upper arm and a lower arm of each phase, but only one semiconductor device 1 is typically shown herein.

The drive circuit 2 is connected to a control gate of the semiconductor device 1, and the microcomputer control section 3 is connected to the drive circuit 2 through optical fibers 8.

The optical fibers comprise a plurality of cables corresponding to the individual phases, but herein is typically shown one optical fiber 8 alone.

A connector portion 4 is arranged at one end of the microcomputer control section 3, and similarly, a connector portion 5 is arranged at one end of the drive circuit 2.

In addition, end connector portions 6, 7 corresponding to the individual connector portions 4, 5 are arranged at opposite ends of each optical fiber 8, respectively.

In this manner, the drive circuit 2 and the microcomputer control section 3 are detachably connected to each other through the optical fibers 8. In addition, by connecting the microcomputer control section 3 and the drive circuit 2 to each other through the optical fibers 8, it is constituted such that electrical insulation can be held between the microcomputer control section 3 of a low voltage and the drive circuit 2 that belongs to a high voltage region.

The optical fibers 8 constitute a communication medium between the microcomputer control section 3 and the drive circuit 2, and form two-way paths 11, 15.

Here, note that as an optical fiber 8, there is used a cable in which the sending and receiving paths 11, 15 are received therein.

The microcomputer control section 3 calculates a control signal (ON/OFF command) to drive the semiconductor device 1, and inputs the control signal to the drive circuit 2 through the path 11.

The drive circuit 2 drives the semiconductor device 1 in accordance with the control signal from the microcomputer control section 3.

In addition, the drive circuit 2 inputs a fault signal and a phase identification signal 32 to the microcomputer control section 3 through the path 15.

The microcomputer control section 3 includes an ON/OFF command generation section 9 that generates an ON/OFF command for the semiconductor device 1, an E/O conversion section 10 that converts an electric signal into an optical signal and outputs the thus converted optical signal, an O/E conversion section 16 that converts the optical signal input from the drive circuit 2 into an electric signal and takes in the thus converted electric signal, a fault processing section 17 that performs fault processing in response to the fault signal input thereto through the O/E conversion section 16, a test signal generation section 29 that generates a test signal 30 based on a test command 28 input thereto from the outside, and a phase identification section 33 that identifies a self or own phase based on a phase identification signal 32 input thereto through the O/E conversion section 16.

The E/O conversion part 10 in the microcomputer control section 3 converts the ON/OFF command and the test signal 30 each comprising an electric signal into optical signals and sends them to the path 11. The O/E conversion section 16 converts the fault signal and the phase identification signal 32 input thereto from the drive circuit 2 as the optical signals into electric signals and inputs the thus converted signals to the fault processing section 17 and the phase identification section 33, respectively.

The fault processing section 17 is constructed such that it takes in the test command 28 from the outside, and does not perform fault processing during the time when the test command 28 is input, even if a fault signal is input from the drive circuit 2.

The phase identification section 33 is constructed such that it identifies its own phase based on the phase identification signal input from the drive circuit 2 through the O/E conversion section 16, and inputs its own phase information to the ON/OFF command generation section 9.

In addition, the ON/OFF command generation section 9 is constructed such that it generates an ON/OFF command corresponding to the own phase when the own phase information from the phase identification section 33 is input.

On the other hand, the drive circuit 2 includes an O/E conversion section 12 that converts an optical signal into an electric signal, a protection detection section 13 that generates a fault signal for the semiconductor device 1, an E/O conversion part 14 that converts the electric signal into an optical signal and sends it to the path 15, and a test signal recognition section 31 that recognizes the test signal 30 input thereto through the O/E conversion section 12.

After converting the ON/OFF command and the test signal 30 (optical signal) input from the microcomputer control section 3 through the path 11 into electric signals, the O/E conversion section 12 drives and controls the semiconductor device 1 by the ON/OFF command, and, inputs the test signal 30 to the test signal recognition section 31.

The test signal recognition section 31 generates the phase identification signal 32 inherent to the own phase (inherent feedback signal) based on the test signal 30 input thereto through the O/E conversion section 12, and inputs it to the E/O conversion section 14.

The protection detection section 13 generates a fault signal and inputs it to the E/O conversion part 14 when a fault or abnormality of the semiconductor device 1 (e.g., an overcurrent, an overvoltage, a reduction in the power supply, an abnormality in temperature, etc.) is detected.

The E/O conversion part 14 converts the phase identification signal 32 and the fault signal from electric signals into optical signals, and sends them to the path 15.

The ON/OFF command (the control signal) and the test signal 30 from the microcomputer control section 3 are sent to the drive circuit 2 through the path 11 comprising the optical fibers 8.

In addition, the feedback signals (the fault signal and the phase identification signal 32) from the drive circuit 2 is sent to the microcomputer control section 3 through the path 15 comprising the optical fibers 8.

The test signal generation section 29 and the phase identification section 33 in the microcomputer control section 3 cooperate with the test signal recognition section 31 in the drive circuit 2 to constitute an optical fiber mis-connection detection section that detects a mis-connection state of the optical fibers 8.

That is, the test signal generation section 29 sends a test signal 30 to the drive circuit 2 through the optical fibers 8 in response to the test command 28 input thereto upon connection of the optical fibers 8, and the test signal recognition section 31 in the drive circuit 2 sends, in response to the test signal 30, the phase identification signal 32 to the phase identification section 33 through the optical fibers 8 as an inherent feedback signal.

The phase identification section 33 is constructed such that it compares the inherent feedback signal (the phase identification signal 32) with the normal feedback signal stored beforehand, and detects a mis-connection state of an optical fiber 8 when both of these signals are in non-coincidence with each other.

Next, reference will be made to the operation of this first embodiment of the present invention, as shown in FIG. 1.

In FIG. 1, it is assumed that the semiconductor device 1, which constitutes the main circuit of the power conversion apparatus, is in a state separated or disconnected from the high voltage region with the optical fibers 8 being in a connected state.

At this time, when a test command 28 is input from the outside to the test signal generation section 29 in the microcomputer control section 3, the test signal generation section 29 generates a test signal 30 and inputs it to the E/O conversion section 10.

The test command 28 is input to the fault processing section 17, whereby fault processing is not executed during the time when the test command 28 is input, even if a fault signal is input.

The E/O conversion section 10 in the microcomputer control section 3 converts the test signal 30 into an optical signal, and inputs it to the O/E conversion section 12 in the drive circuit 2 through the path 11.

The O/E conversion section 12 in the drive circuit 2 converts the test signal 30 from an optical signal into an electric signal, and inputs it to the test signal recognition section 31.

At this time, the power conversion apparatus is in a no-voltage state, so even if the test signal 30 is impressed through the O/E conversion section 12 on the semiconductor device 1 as an ON signal thereby to turn on the semiconductor device 1, no adverse influence will be exerted on the power conversion apparatus.

The test signal recognition section 31 generates phase identification signals 32 inherent to the individual phases (electric signals), respectively, based on the test signal 30, and inputs them to the E/O conversion section 14.

The E/O conversion section 14 in the drive circuit 2 converts the phase identification signal 32 into an optical signal, and then inputs it to the O/E conversion section 16 in the microcomputer control section 3 through the path 15.

During an ordinary power conversion operation, the ON/OFF command generated from the ON/OFF command generation section 9 is sent to the O/E conversion section 12 in the drive circuit 2 through the E/O conversion section 10 and the path 11 of the optical fibers 8.

The ON/OFF command input to the O/E conversion section 12 is converted into an electric signal, which is impressed to the semiconductor device 1 thereby to turn on and off the semiconductor device 1.

In addition, the protection detection section 13 in the drive circuit 2 generates a fault signal (electric signal) that indicates the presence or absence of the abnormality of the semiconductor device 1, and inputs it to the E/O conversion section 14.

The E/O conversion section 14 converts the fault signal into an optical signal, and inputs it to the O/E conversion section 16 in the microcomputer control section 3 through the path 15 of the optical fibers 8.

The O/E conversion section 16 converts the fault signal of the semiconductor device 1 input thereto as an optical signal into an electric signal, and inputs it to the fault processing section 17.

When the fault signal indicates the state of abnormality occurrence, the fault processing section 17 stops the driving control of the power conversion apparatus by the microcomputer control section 3.

On the other hand, as stated above, after it the phase identification signal 32 generated from the test signal recognition section 31 in response to the test signal 30 is converted into an optical signal by the E/O conversion section 14 in the drive circuit 2, and then input to the O/E conversion section 16 in the microcomputer control section 3 through the path 15 of the optical fibers 8.

Here, further detailed reference will be made to the example of a case where the main circuit having the semiconductor device 1 is formed of a three-phase two-level inverter, while referring to FIG. 2.

Figure 2:
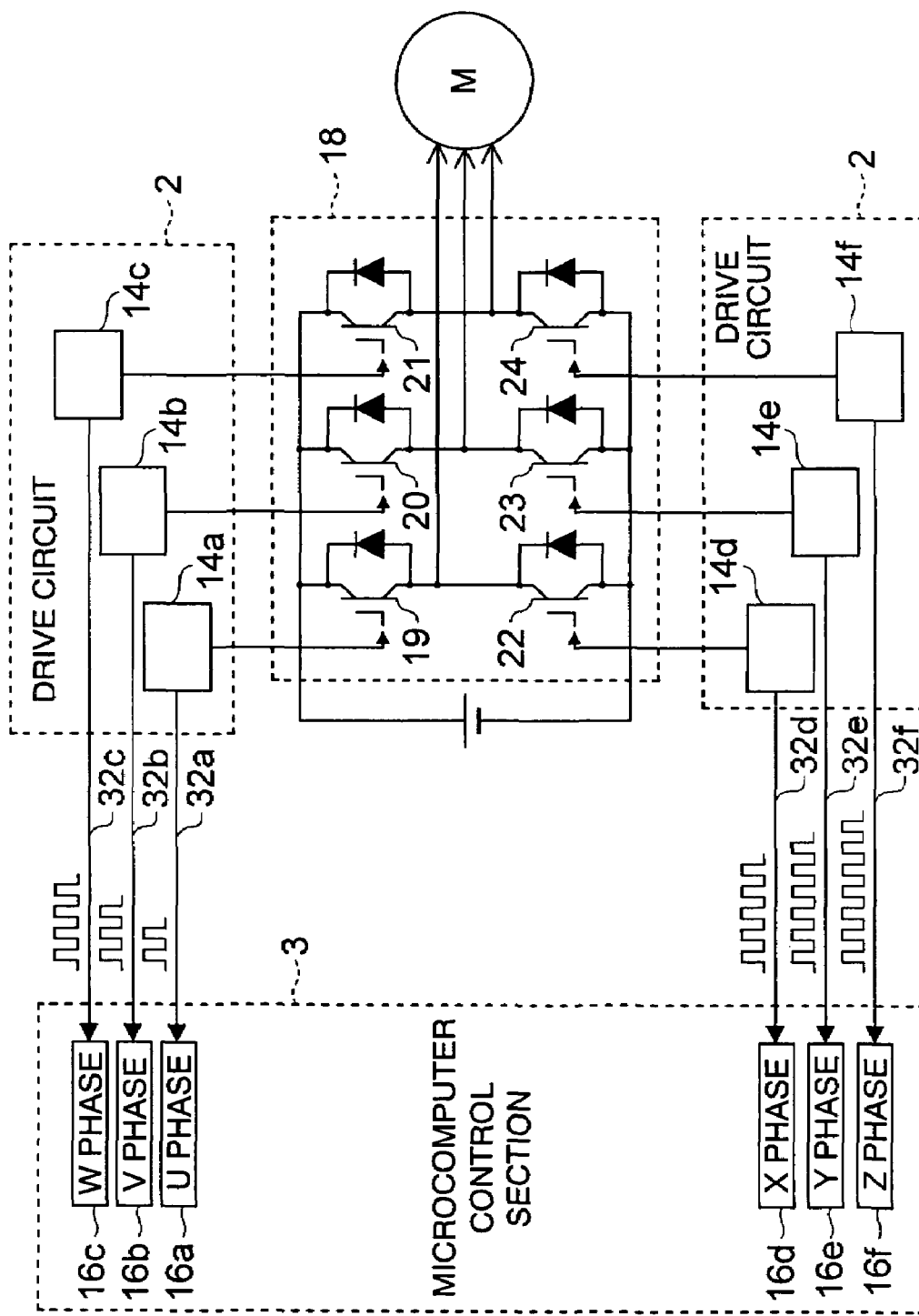
FIG. 2 is a circuit block diagram specifically showing the construction of a part in FIG. 1 (Embodiment 1).

FIG. 2 is a circuit block diagram that specifically shows the construction of a part in FIG. 1, wherein only the drive circuit 2 and the individual E/O conversion section and the O/E conversion section in the microcomputer control section 3 are specifically illustrated in association with a plurality of semiconductor devices in a three-phase two-level inverter 18.

In FIG. 2, in order to drive a three-phase motor M, the three-phase two-level inverter 18 includes, as the semiconductor device 1, a U phase semiconductor device 19, a V phase semiconductor device 20 and a W phase semiconductor device 21 at an upper arm side, and an X phase semiconductor device 22, a Y phase semiconductor device 23 and a Z phase semiconductor device 24 at a lower arm side.

The drive circuit 2 includes, as the E/O conversion section 14, a U phase E/O conversion section 14a, a V phase E/O conversion section 14b and a W phase E/O conversion section 14c corresponding to an upper arm of the three-phase two-level inverter 18, and an X phase E/O conversion section 14d, a Y phase E/O conversion section 14e and a Z phase E/O conversion section 14f corresponding to a lower arm of the three-phase two-level inverter 18.

The drive circuit 2 generates, as the phase identification signal 32 at the upper arm side, a U phase identification signal 32a in the form of a two-shot pulse from the U phase E/O conversion section 14a, generates a V phase identification signal 32b in the form of a three-shot pulse from the V phase E/O conversion section 14b, and generates a W phase identification signal 32c in the form of a four-shot pulse from the W phase E/O conversion section 14c.

Similarly, the drive circuit 2 generates, as the phase identification signal 32 at the lower arm side, an X phase identification signal 32d in the form of a five-shot pulse from the X phase E/O conversion section 14d, generates a Y phase identification signal 32e in the form of a six-shot pulse from the Y phase E/O conversion section 14e, and generates a Z phase identification signal 32f in the form of a seven-shot pulse from the Z phase E/O conversion section 14f.

Though not illustrated in FIG. 2, six cables corresponding to the phase identification signals 32a through 32f of the individual phases, respectively, are connected as the optical fibers 8 (see FIG. 1).

In order to convert the individual phase identification signals 32a through 32f (optical signals) input from the drive circuit 2 into electric signals, the microcomputer control section 3 includes, as the O/E conversion section 16, a U phase O/E conversion section 16a, a V phase O/E conversion section 16b, a W phase O/E conversion section 16c, an X phase O/E conversion section 16d, a Y phase O/E conversion section 16e, and a Z phase O/E conversion section 16f.

According to the circuit configuration of FIG. 2, the individual phase identification signals 32a through 32f in the form of two-shot through seven-shot pulses are input, as the phase identification signal 32, from the individual phase E/O conversion sections 14a through 14f in the drive circuit 2 to the individual phase O/E conversion sections 16a through 16f in the microcomputer control section 3, respectively.

Here, it is assumed that the setting of the individual phase identification signals 32a through 32f can be made by hardware, e.g., by means of jumper pins on a control board of the drive circuit 2, etc.

The individual phase O/E conversion sections 16a through 16f in the microcomputer control section 3 convert the individual phase identification signals 32a through 32f in the form of optical signals into electric signals, and inputs them to the fault processing section 17 and the phase identification section 33 (see FIG. 1), as previously stated.

Here, note that at this time, the fault processing section 17 is masked by the test command 28, and hence does not perform fault processing even if the individual phase identification signals 32a through 32f are input together with a fault signal.

On the other hand, upon input of the phase identification signal 32, the phase identification section 33 verifies the consistency of the connection of the optical fibers 8 by verifying coincidence/non-coincidence between the individual phase identification signals 32a through 32f being input and the phase identification signals of the individual phases stored beforehand.

Thus, the microcomputer control section 3 can determine, based on the individual phase identification signals 32a through 32f input from the drive circuit 2, to which phase of the drive circuit 2 itself is connected.

Accordingly, in case where optical fibers 8 are mis-connected, an error or mis-connected location can be found in an easy manner, whereby a malfunction or failure of the power conversion apparatus can be avoided.

Next, reference will be made to an identification operation of this embodiment when the optical fibers 8 shown in FIG. 1 are mis-connected, while referring to FIG. 2 and FIG. 3.

Figure 3:
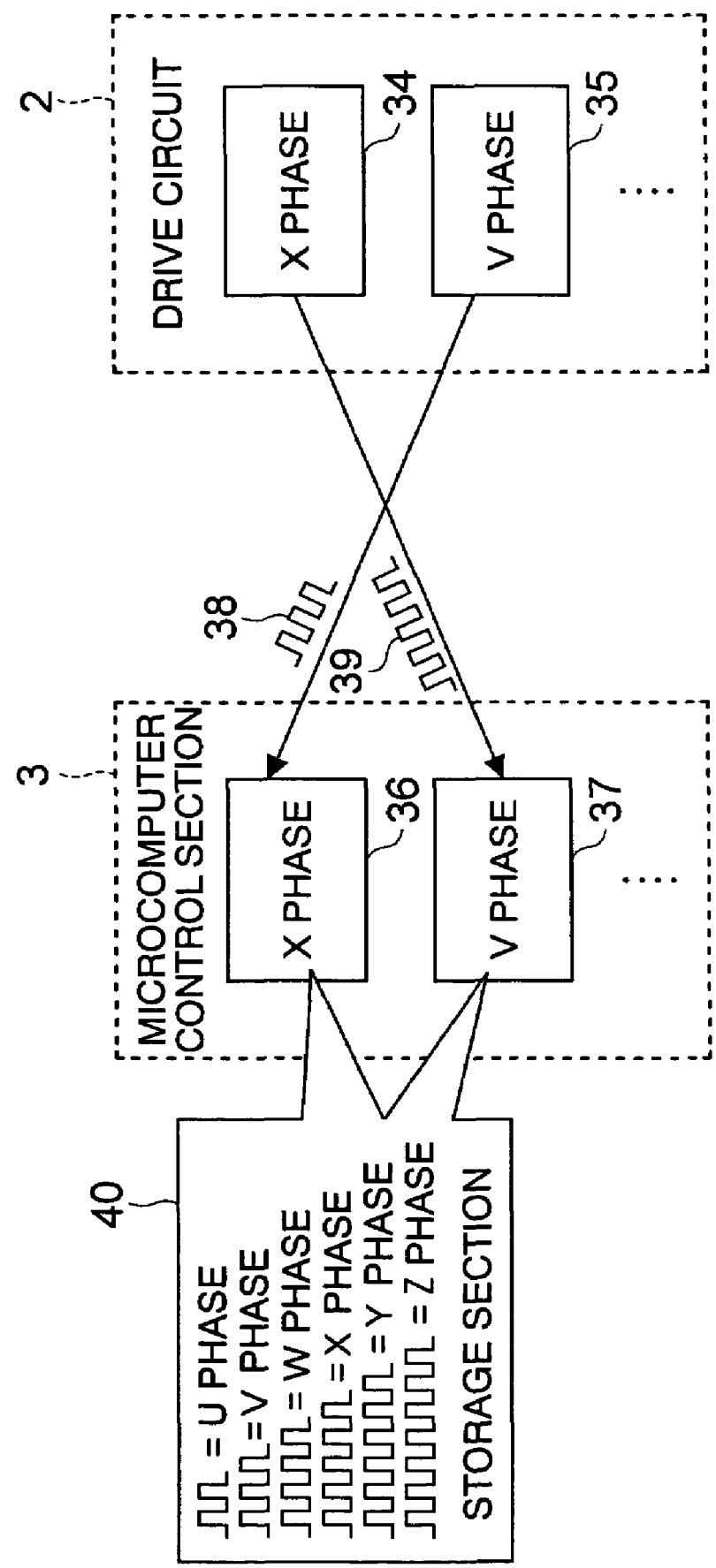
FIG. 3 is an explanatory view showing a state of mis-connection between an X phase and a V phase in the first embodiment of the present invention (Embodiment 1).

FIG. 3 is an explanatory view that shows a state in which the X phase and the V phase of the drive circuit 2 and the microcomputer control section 3 are exchanged or reversed with each other with only the X and V phases among the U through Z phases being typically illustrated.

In FIG. 3, the drive circuit 2 includes an X phase part 34 and a V phase part 35, and similarly, the microcomputer control section 3 includes an X phase part 36 and a V phase part 37.

In addition, the X phase part 36 and the V phase part 37 in the microcomputer control section 3 include storage sections 40, respectively, and pieces of information on the individual phases are stored beforehand in the individual storage sections 40, respectively.

Specifically, a two-shot pulse=the U phase identification signal 32a, a three-shot pulse=the V phase identification signal 32b, a four-shot pulse=the W phase identification signal 32c, a five-shot pulse=the X phase identification signal 32d, a six-shot pulse=the Y phase identification signal 32e, and a seven-shot pulse=the Z phase identification signal 32f are beforehand stored as phase information in the storage sections 40, respectively.

As shown in FIG. 3, for example, when the optical fibers 8 that corresponds to the X phase semiconductor device 22 and the V phase semiconductor device 20 in the three-phase two-level inverter 18 (see FIG. 2) are mis-connected, the X phase part 34 in the drive circuit 2 inputs an X phase identification signal 39 in the form of a five-shot pulse generated with the above-mentioned jumper setting, etc., to the V phase part 37 in the microcomputer control section 3 in accordance with the input of a test signal 30 (see FIG. 1).

Also, the V phase part 35 in the drive circuit 2 inputs a V phase identification signal 38 in the form of a three-shot pulse to the X phase part 36 in the microcomputer control section 3.

At this time, phase information "input signal in the form of a five-shot pulse=X phase" is stored beforehand in the storage section 40 in the X phase part 36 of the microcomputer control section 3, so when the V phase identification signal 38 (three-shot pulse) from the V phase part 35 in the drive circuit 2 is input, mismatch or non-coincidence between the five-shot pulse and the three-shot pulse is verified and a mis-connection state is detected.

In addition, simultaneously with this, other phase information "three-shot pulse=V phase" is stored, so the mis-connection state can be determined in which the X phase is reversed with the V phase.

Similarly, phase information "three-shot pulse signal=V phase" is stored beforehand in the V phase part 37 of the microcomputer control section 3, so when an X phase identification signal 39 (five-shot pulse) from the X phase part 34 in the drive circuit 2 is input, mismatch or non-coincidence between the three-shot pulse and the five-shot pulse is verified and a mis-connection state is detected. In addition, simultaneously with this, other phase information "five-shot pulse=X phase" is stored, so the mis-connection state can be determined in which the X phase is reversed with the V phase.

As described above, provision is made for the drive circuit 2 that drives the semiconductor device(s) 1 (19 through 24) of the three-phase two-level inverter 18, the microcomputer control section 3 that controls the drive circuit 2, and a two-way communication medium in the form of the optical fibers 8 between the drive circuit 2 and the microcomputer control section 3, wherein the microcomputer control section 3 and the drive circuit 2 are connected to each other through the individual connector portions 4, 5, and the end connector portions 6, 7 of the optical fibers 8.

The microcomputer control section 3 includes the ON/OFF command generation section 9 that generates a control signal for the semiconductor device 1, the test signal generation section 29 that generates a test signal 30 in response to a test command 28 from the outside, and the E/O conversion section 10 that converts an ON/OFF command and the test signal 30 from electric signals into optical signals, the O/E conversion section 16 that converts a fault signal and a phase identification signal 32, which are input from the drive circuit 2, from optical signals into electric signals, and the fault processing section 17 that performs fault processing based on the fault signal, and the phase identification section 33 that identifies its own phase from the phase identification signal 32.

On the other hand, the drive circuit 2 includes the O/E conversion section 12 that converts the ON/OFF command and the test signal 30 input from the microcomputer control section 3 from electric signals into optical signals, the test signal recognition section 31 that generates a phase identification signal 32 inherent to the own phase based on the test signal 30, the protection detection section 13 that generates a fault signal for the semiconductor device 1, and the E/O conversion section 14 that converts the phase identification signal 32 and the fault signal from electric signals into optical signals.

The fault processing section 17 in the microcomputer control section 3 does not perform fault processing when the test command 28 is input, even if a fault signal is input from the drive circuit 2.

In addition, the phase identification section 33 in the microcomputer control section 3 includes the storage sections 40, and data for identifying the phase identification signals 32 corresponding to the individual phases is stored beforehand in the storage sections 40.

As a result, the mis-connection state of the optical fibers 8 can be determined by determining the right or wrong of the phase identification signal 32 (inherent feedback signal) generated from the test signal recognition section 31 in the drive circuit 2 in accordance with the test signal 30.

Accordingly, it is possible to make efficient the testing and the production of the power conversion apparatus which can prevent an abnormal operation, an occurrence of fault, etc., of the power conversion apparatus due to the mis-connection of the optical fibers 8.

Embodiment 2

Figure 4:
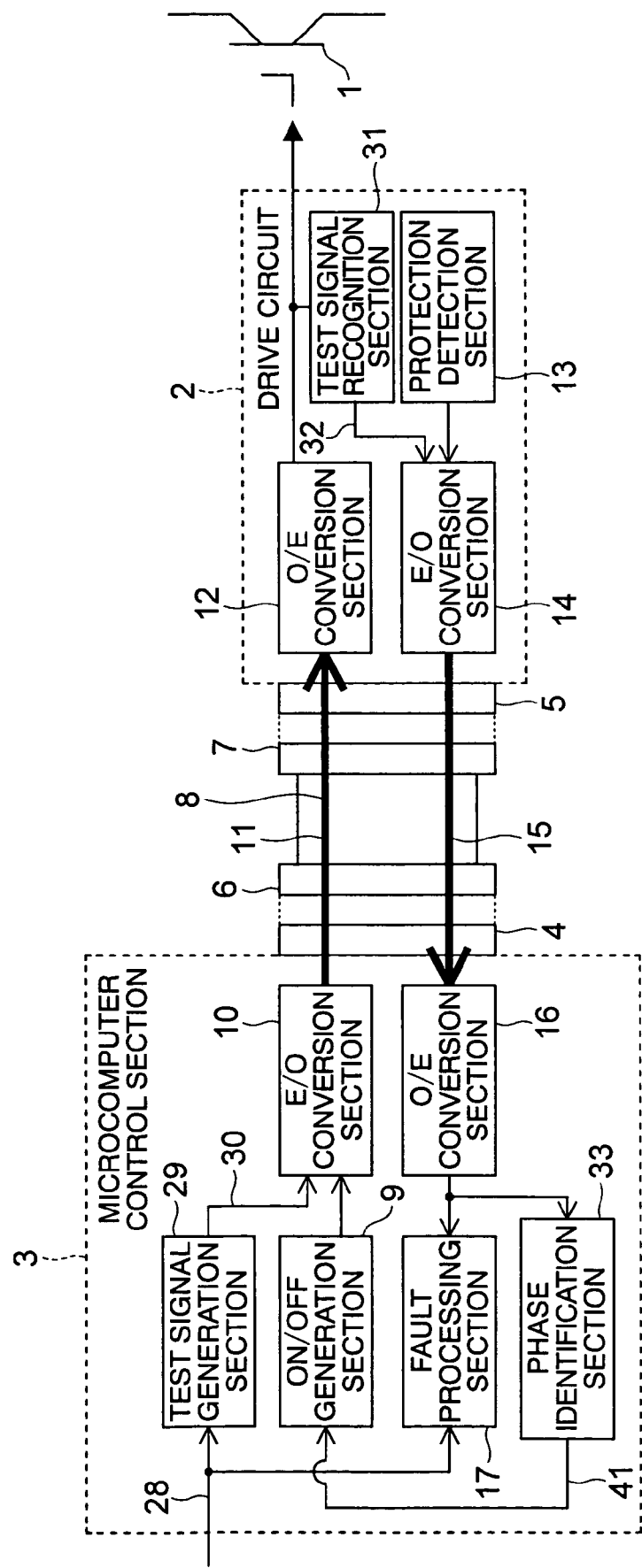
FIG. 4 is a block diagram showing a power conversion apparatus according to a second embodiment of the present invention (Embodiment 2).

Although in the above-mentioned first embodiment, transmission information from the phase identification section 33 to the ON/OFF command generation section 9 has not been specifically described, connection information 41 including own phase information may be sent, as shown in FIG. 4, for example.

FIG. 4 is a block diagram that shows a power conversion apparatus according to a second embodiment of the present invention, in which the same or corresponding parts or elements as those as described above (see FIG. 1 are identified by the same symbols while omitting a detailed explanation thereof.

In this case, the phase identification section 33 determines the own phase based on the phase identification signal 32 input from the drive circuit 2 during the mis-connection of the optical fibers 8, and sends to the ON/OFF command generation section 9 the connection information 41 including the own phase information that indicates to which phase the own phase is actually connected.

In addition, the ON/OFF command generation section 9 generates an ON/OFF command 42 corresponding to the own phase when the own phase information from the phase identification section 33 is input.

Next, reference will be made to an identification operation of this embodiment when the optical fibers 8 shown in FIG. 4 is mis-connected, while referring to FIG. 5.

FIG. 5 is an explanatory view that shows a mis-connection state in the second embodiment of the present invention, in which the same or like parts or elements as those described above (see FIG. 3) are identified by the same symbols while omitting a detailed description thereof. In FIG. 5, only an X phase and a V phase among a U phase through a Z phase are typically illustrated, as stated above.

As shown in FIG. 5, for example, when the optical fibers 8 corresponding to the X phase semiconductor device 22 and the V phase semiconductor device 20 in the three-phase two-level inverter 18 (see FIG. 2) are exchanged or reversed with each other to give rise to a mis-connection, an X phase identification signal 39 and a V phase identification signal 38 are generated from the X phase part 34 and the V phase part 35 in the drive circuit 2, respectively, and are input to the V phase part 37 and the X phase part 36 in the microcomputer control section 3, respectively, as stated above.

In FIG. 5, the X phase part 36 in the microcomputer control section 3 is provided with an X phase E/O conversion section 10d, an X phase identification section 33d, an X phase ON/OFF generation section 9d, and an X phase O/E conversion section 16d.

Similarly, the V phase part 37 is provided with a V phase O/E conversion section 10b, a V phase identification section 33b, a V phase ON/OFF generation section 9b, and a V phase O/E conversion section 16b.

The X phase O/E conversion section 10d generates a V phase identification signal 32b in the form of a three-shot pulse based on the V phase identification signal 38 from the drive circuit 2, and inputs it to the X phase identification section 33d.

The X phase identification section 33d generates V phase connection information 41b from the V phase identification signal 32b, and inputs it to the X phase ON/OFF generation section 9d.

The X phase ON/OFF generation section 9d generates a normal V phase ON/OFF command 42b corresponding to the V phase from the V phase connection information 41b, and inputs it to the X phase O/E conversion section 16d.

On the other hand, the V phase O/E conversion section 10b generates an X phase identification signal 32d in the form of a five-shot pulse based on the X phase identification signal 39 from the drive circuit 2, and inputs it to the V phase identification section 33b.

The V phase identification section 33*b* generates X phase connection information 41*d* from the X phase identification signal 32*d*, and inputs it to the V phase ON/OFF generation section 9*b*.

The V phase ON/OFF generation section 9*b* generates a normal X phase ON/OFF command 42*d* corresponding to the X phase from the X phase connection information 41*d*, and inputs it to the V phase O/E conversion section 16*b*.

In other words, the V phase ON/OFF command 42*b* for the V phase part 35 in the drive circuit 2 is generated from the X phase part 36 in the microcomputer control section 3, and the X phase ON/OFF command 42*d* for the X phase part 34 in the drive circuit 2 is generated from the V phase part 37 in the microcomputer control section 3.

Accordingly, the individual O/E conversion sections 16*d*, 16*b* convert the individual normal ON/OFF commands 42*d*, 42*b* into optical signals and input them to the drive circuit 2 during the ordinary operation of the power conversion apparatus, and switch the normal V phase semiconductor device 20 and the normal X phase semiconductor device 22 (see FIG. 2).

Thus, an optical fiber mis-connection detection section, which comprises the test signal recognition section 31 in the drive circuit 2 and the test signal generation section 29 and the phase identification section 33 in the microcomputer control section 3, recognizes the phase of the semiconductor device 1 corresponding to the inherent feedback signal (the phase identification signal 32), and detects the mis-connected state of the optical fibers 8 in an automatic manner.

In addition, the phase identification section 33 (33*d*, 33*b*) and the ON/OFF command generation section 9 (9*d*, 9*b*) together constitute a phase conversion section that automatically performs phase conversion, automatically converts, upon detection of the mis-connected state of the optical fibers 8 by the optical fiber mis-connection detection section, the phases corresponding to the inherent feedback signals (the V phase identification signal 38, the X phase identification signal 39) for the mis-connection to be detected into normal identification signals (the V phase identification signal 32*b*, the X phase identification signal 32*d*), and outputs them as control signals 41 (41*d*, 41*b*).

Accordingly, the X phase O/E conversion section 16*d* and the V phase O/E conversion section 16*b* can output the V phase ON/OFF command 42*b* and the X phase ON/OFF command 42*d* to drive the V phase semiconductor device 20 and the X phase semiconductor device 22 corresponding to the normal phases, respectively, after having been automatically converted by the phase conversion section.

As a result, the sequence of the individual phases can be automatically switched into the normal sequence, whereby it is possible to make the power conversion apparatus perform normal operation in an automatic and reliable manner.

In addition, the abnormal operation and the failure of power conversion apparatus due to the mis-connection of the optical fibers 8 can be prevented, and besides, the phase sequence can be automatically switched into the normal one, so there becomes no need to do work for finding and determining an error location, thus making the testing and the production of the apparatus more efficient.

Here, note that in the above-mentioned first and second embodiments, the ON/OFF command generation section 9 (9*a*, 9*b*), the fault processing section 17, the test signal generation section 29 and the phase identification section 33 (33*a*, 33*b*) in the microcomputer control section 3 can be achieved by merely changing the logic by the use of a high-speed logic circuit (FPGA), software, etc.

In addition, although in the above-mentioned first embodiment, the description has been given by taking, as an example, the case of the three-phase two-level inverter 18, it is needless to say that the present invention is not limited to this, but can instead be applied to other inverters or converters, while achieving operational effects equivalent to the above-mentioned ones.

The invention claimed is:

1. A power conversion apparatus comprising:

an inverter or a converter having a plurality of individual semiconductor devices corresponding to a plurality of phases;

a microcomputer control section that calculates and outputs a plurality of individual control signals to drive said individual semiconductor devices, respectively;

a drive circuit that drives said individual semiconductor devices in accordance with said individual control signals; and a plurality of optical fibers that are connected between said microcomputer control section and said drive circuit so as to correspond to said individual semiconductor devices thereby to form communication mediums;

wherein said drive circuit includes a test signal recognition section that outputs inherent feedback signals corresponding to said individual semiconductor devices in response to test signals from said microcomputer control section;

said microcomputer control section includes an optical fiber mis-connection detection section that detects a mis-connection state of said optical fibers based on said inherent feedback signals;

said control signals and said test signals corresponding to said semiconductor devices, respectively, are sent from said microcomputer control section to said drive circuit through said individual optical fibers, and inherent feedback signals corresponding to the individual semiconductor devices, respectively, are sent from said drive circuit to said microcomputer control section;

at the time of connection of said plurality of optical fibers, said optical fiber mis-connection detection section sends said individual test signals to said drive circuit through said individual optical fibers;

said drive circuit sends, through said individual optical fibers, said inherent feedback signals corresponding to the individual test signals to said optical fiber mis-connection detection section; and said optical fiber mis-connection detection section compares said individual inherent feedback signals with individual normal feedback signals stored beforehand, and detects a mis-connected state of said plurality of optical fibers when at least one of said inherent feedback signals does not coincide with said normal feedback signal.

2. The power conversion apparatus as set forth in claim 1, wherein said optical fiber mis-connection detection section comprises:

a test signal generation section that generates said test signals in response to a test command from the outside; and a phase identification section that identifies its own phase based on said inherent feedback signal.

3. The power conversion apparatus as set forth in claim 1, wherein said microcomputer control section comprises a phase conversion section that recognizes the phases of semiconductor devices corresponding to said inherent feedback signals, and performs phase conversion in an automatic manner;

when the mis-connected state of said optical fibers is detected by said optical fiber mis-connection detection section, said phase conversion section automatically converts the phases corresponding to said inherent feedback signals for which mis-connection is to be detected; and said microcomputer control section outputs the control signals to drive said semiconductor devices corresponding to the phases which have been automatically converted by said phase conversion section.

* * * * *